United States Patent [19]
Hiben et al.

[11] Patent Number: 5,465,410
[45] Date of Patent: Nov. 7, 1995

[54] METHOD AND APPARATUS FOR AUTOMATIC FREQUENCY AND BANDWIDTH CONTROL

[75] Inventors: Bradley M. Hiben, Glen Ellyn; Donald G. Newberg, Schaumburg; Robert D. Logalbo, Bartlett, all of Ill.

[73] Assignee: Motorola, Inc., Schaumburg, Ill.

[21] Appl. No.: 343,298

[22] Filed: Nov. 22, 1994

[51] Int. Cl.⁶ .................................................. H04B 1/10
[52] U.S. Cl. .................. 455/266; 455/340; 455/337; 455/339; 455/205; 455/226.1; 455/182.2; 455/192.2; 455/306; 455/307
[58] Field of Search ................. 455/205, 226.1, 455/266, 337, 339, 340, 182.2, 192.2, 200.1, 306, 307; 370/69.1; 381/103; 333/18

[56] References Cited

U.S. PATENT DOCUMENTS 5,155,862  10/1992  Hansen ................................. 455/266
5,339,455   8/1994  Vogt et al. ............................ 455/266

Primary Examiner—Reinhard J. Eisenzopf
Assistant Examiner—Marsha D. Banks-Harold
Attorney, Agent, or Firm—James A. Coffing

[57] ABSTRACT

An FM receiver (100) that includes a plurality of filtering elements (120–124) that have various center frequencies and bandwidths that adjust to maximize the signal quality of a desired signal (104) recovers the desired signal (104) by inputting the desired signal (104) to each of the plurality of filtering elements (120–124). Signal recovery is performed on an output of each of the filtering elements (120–124) to obtain a plurality of recovered signals. The recovered signals are then measured to obtain a plurality of signal quality metrics for the desired signal.

33 Claims, 4 Drawing Sheets

100

METHOD AND APPARATUS FOR AUTOMATIC FREQUENCY AND BANDWIDTH CONTROL

FIELD OF THE INVENTION

The present invention relates generally to the field of FM receivers, including FM receivers having filters for reducing adjacent channel interference.

BACKGROUND OF THE INVENTION

FM receivers are used to receive desired carrier signals in narrow frequency bands. Such receivers typically include a static filter that filters out all but a predetermined band of desired frequencies. Automatic Frequency Control (AFC) systems are known, which improve sensitivity in radios having modest frequency stability performance. In AFC systems, the output of a receiver discriminator is low pass filtered at a very low frequency. The output of the filter is then driven to zero volts by adjusting the frequency of a local oscillator. An advantage of this system is that there is no ambiguity about which way to adjust the frequency of the local oscillator to compensate for the frequency offset and interference. In these systems, the low pass filtered discriminator output is proportional, in both magnitude and sign, to the local oscillator adjustment required.

AFC systems operate under the assumption that there is negligible low frequency content in the desired signal. The AFC systems also operate with the assumption that centering the signal maximizes the signal-to-noise ratio. These assumptions work well for 25 kHz and 30 kHz channel land-mobile radio systems where adjacent channel interference is negligible. In these systems, adjacent channel interference protection levels of 80 dB or more are common.

Increasingly, however, land mobile radio users are requiring spectrally efficient high-speed digital systems. In response, one standards setting body is initiating a 9.6 kbps, 12.5 kHz channel system proposal and the Federal Communications Commission is splitting 25 kHz and 30 kHz channels into 12.5 kHz channels. As this narrow-banding occurs, it reduces the adjacent channel interference protection levels by 20 dB or more. Thus, in these 12.5 kHz channel systems, substantial adjacent channel interference is present. This interference is expected to degrade coverage in some frequency bands and geographical areas, as compared to what is currently available.

As a result of the increase in adjacent channel interference present when narrow-banding, the approach of minimizing frequency offset is not necessarily the most beneficial. In fact, in some interference cases it is better to adjust the receiver away from the desired signal. In these cases, the sensitivity degradation is minimized at a frequency in the opposite direction from the desired transmission. There is no way in the prior art to utilize this signal improvement technique (i.e., adjusting the receiver away from the desired signal).

Thus, a need exists to improve received signal quality in a narrow-band communication system by reducing adjacent channel interference.

DESCRIPTION OF A PREFERRED EMBODIMENT

Generally, the present invention provides a method and apparatus for recovering a desired signal by reducing the effect of adjacent channel interference within an FM receiver. This is accomplished by equipping the FM receiver with a plurality of intermediate frequency (IF) filtering elements having varying—and adjustable—bandwidth and center frequency characteristics. Each of these IF filtering elements receives at least part of the desired signal. The signal quality of the recovered signals output by each of these IF filtering elements is then measured, using any of the various signal quality metrics known in the art. In the foregoing manner, a desired signal can be filtered using an optimal filtering scheme selected on the basis of measured signal quality.

Figure 1:
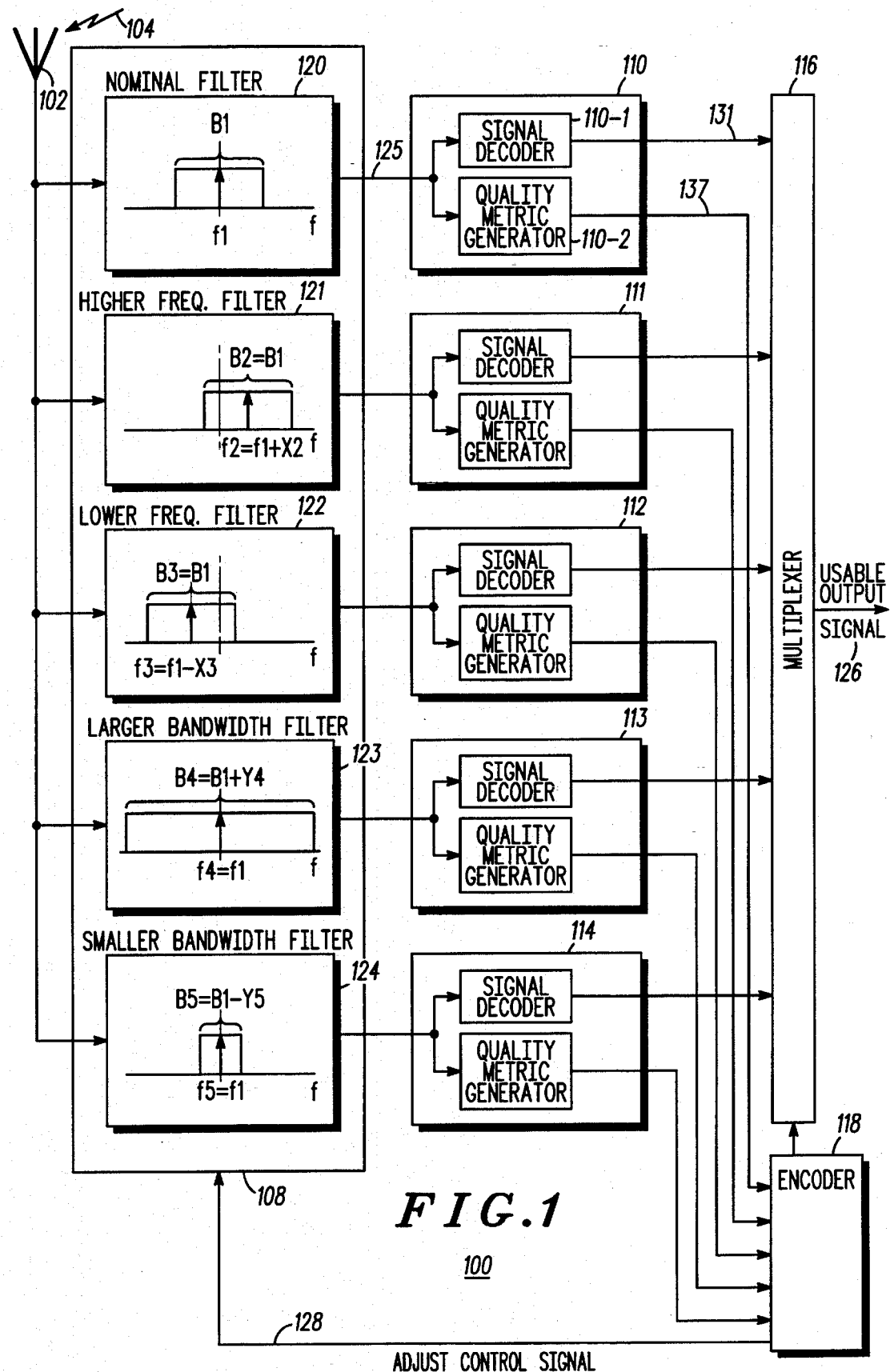
FIG. 1 is a simplified block diagram of an FM receiver, in accordance with the present invention.

The present invention can be more fully described with references to FIGS. 1–4. FIG. 1 illustrates an FM receiver (100) having an antenna (102) which receives a desired signal (104). The FM receiver (100) includes a filter bank (108), a plurality of signal recoverers (110–114), a multiplexer (116), and an encoder (118).

The signal recoverers (110–114) each contain a signal decoder and a quality metric generator. As an example, a signal recoverer (110) receives an output (125) from a filtering element (120). At least a part of the signal is sent to a signal decoder (110-1), which decodes the output (125) of the filter and sends this recovered signal (131) to the multiplexer (116). At least part of the signal is also sent to the quality metric generator (110-2), which determines the quality of the signal and sends a signal quality metric (137) to the encoder (118). The encoder (118) identifies a favorably recovered signal (e.g., the one having the highest signal quality metric), and advises the multiplexer (116) as to which recovered signal has been identified. The multiplexer (116) then forms a usable output signal (126) based on the identified, recovered signal. The encoder (118) also generates an adjust control signal (128) that is used by the filter bank (108) to provide adjustments to the filtering elements, as later described.

The filter bank (108) comprises a plurality of filtering elements. In a preferred embodiment, the filter bank comprises five intermediate frequency (IF) filters (120–124) of various bandwidths and frequency offsets, as shown. It is well understood that the filtering elements might also be implemented using a digital signal processor (DSP) preceded by an analog-to-digital converter. In a preferred embodiment, one filter has a nominal bandwidth and a nominal frequency offset—i.e., the nominal filter employs a single fixed frequency offset and bandwidth that is employed in a typical receiver. The other four filters have frequency offsets above and below the nominal frequency offset and bandwidths larger and smaller than the nominal bandwidth. This variety of filters increases the probability of recovering a signal of optimal quality during a communication. An alternate embodiment of the invention might include a varying number of filtering elements (e.g., three filters comprised of a nominal filter, a higher frequency filter, and a lower frequency filter, or a nominal filter, a larger bandwidth filter, and a smaller bandwidth filter).

As earlier mentioned, the preferred filter bank (108) includes a nominal filter (120) with a center frequency f1 and a bandwidth B1. This filter (120) has the nominal frequency offset and nominal bandwidth. For a typical receiver, such as an APCO 25 compliant receiver, the nominal filter bandwidth is approximately 5.76 kHz. The frequency offset of the nominal filter (120) is zero, meaning that the center frequency of the filter is tuned to the center of the desired radio frequency (RF) channel. It should be understood that most modern radio receivers are of the superheterodyne type, and that RF frequency is translated to the IF frequency by mixing the RF signal with a signal generated by a local oscillator. The IF filter is said to be centered on the desired RF channel frequency even though the RF and IF frequencies are in fact different.

The higher frequency filter (121) in the filter bank (108) has a bandwidth B2 equal to B1, the bandwidth of the nominal filter (120). The center frequency of the higher frequency filter (121) f2 is displaced X2 Hz higher in frequency than f1, the center frequency of the nominal filter (120), wherein X2 is a variable frequency offset. For a typical receiver, such as an APCO 25 compliant receiver, the initial value of X2 would be approximately 1 kHz. Thus, when receiving a desired signal displaced more than approximately 500 Hz higher than the nominal frequency, the higher frequency filter (121) ordinarily outputs a signal having a more favorable signal quality metric than the signal output by the nominal filter (120). It should be understood, however, that because the higher frequency filter may be close to the upper adjacent channel (adjacent channel having a frequency higher than the nominal frequency), the higher frequency filter (121) may intercept interference power from this channel. Therefore, the nominal filter (120) may output a more favorable signal quality metric than the higher frequency filter (121), even though the desired signal is displaced higher in frequency by more than approximately 500 Hz.

The lower frequency filter (122) in the filter bank (108) has a bandwidth B3 equal to B1, and a center frequency f3 displaced X3 Hz below f1, the center frequency of the nominal filter (120). The lower frequency filter (122) intercepts much less interference power from the upper adjacent channel and receives only slight distortion of the desired signal due to frequency offset. Thus, even if the desired signal is displaced in frequency toward the upper adjacent channel, if the upper adjacent channel causes .interference, the lower frequency filter (122) might output a signal having a more favorable signal quality metric than signals output by either the nominal filter (120) or the higher frequency filter (121).

The larger bandwidth filter (123) in the filter bank (108) has a center frequency f4, equal to the center frequency of the nominal filter (120), f1. The bandwidth B4 of the larger bandwidth filter (123), is Y4 Hz larger than the bandwidth B1 of the nominal filter (120), where Y4 is a variable bandwidth offset. The large bandwidth of this larger bandwidth filter (123) reduces the distortion of the desired signal. Thus, this filter is beneficial in cases of relatively high RF signal strength and low interference.

The smaller bandwidth filter (124) in the filter bank (108) has a center frequency f5, equal to f1, and a bandwidth B5, that is Y5 Hz smaller than B1. This filter maximizes the signal quality metric of the recovered signal when interference is present from both upper and lower adjacent channels. In this case, filters with frequency adjusted higher or lower in frequency from f1, or with a bandwidth larger than B1, still intercept the adjacent channel interference. Thus, a filter (124) having a narrower bandwidth might yield a favorable signal quality metric.

The center frequencies and the bandwidths of the filters are adjusted in a signal recovery process that selects a filter having properties that maximize the signal quality of the recovered signal. The signal recovery process evaluates the signal quality metrics of the recovered signals and selects the filter having the favorable signal quality metric. It should be noted that selecting the filter producing the signal having the highest signal quality metric is correlated to whether a positive or negative frequency offset or a wider or narrower bandwidth is required to optimize the received signal quality. Accordingly, this selection process might be repeated, while the communication remains in progress, so as to continually optimize receiver performance in the presence of time-variant interference signals. (It should be noted that changes in perceived signal quality might be the result of a variety of circumstances. For example, during a call on a first channel, communication on an adjacent channel might be terminated, thereby eliminating interference due to that channel.)

Figure 2:
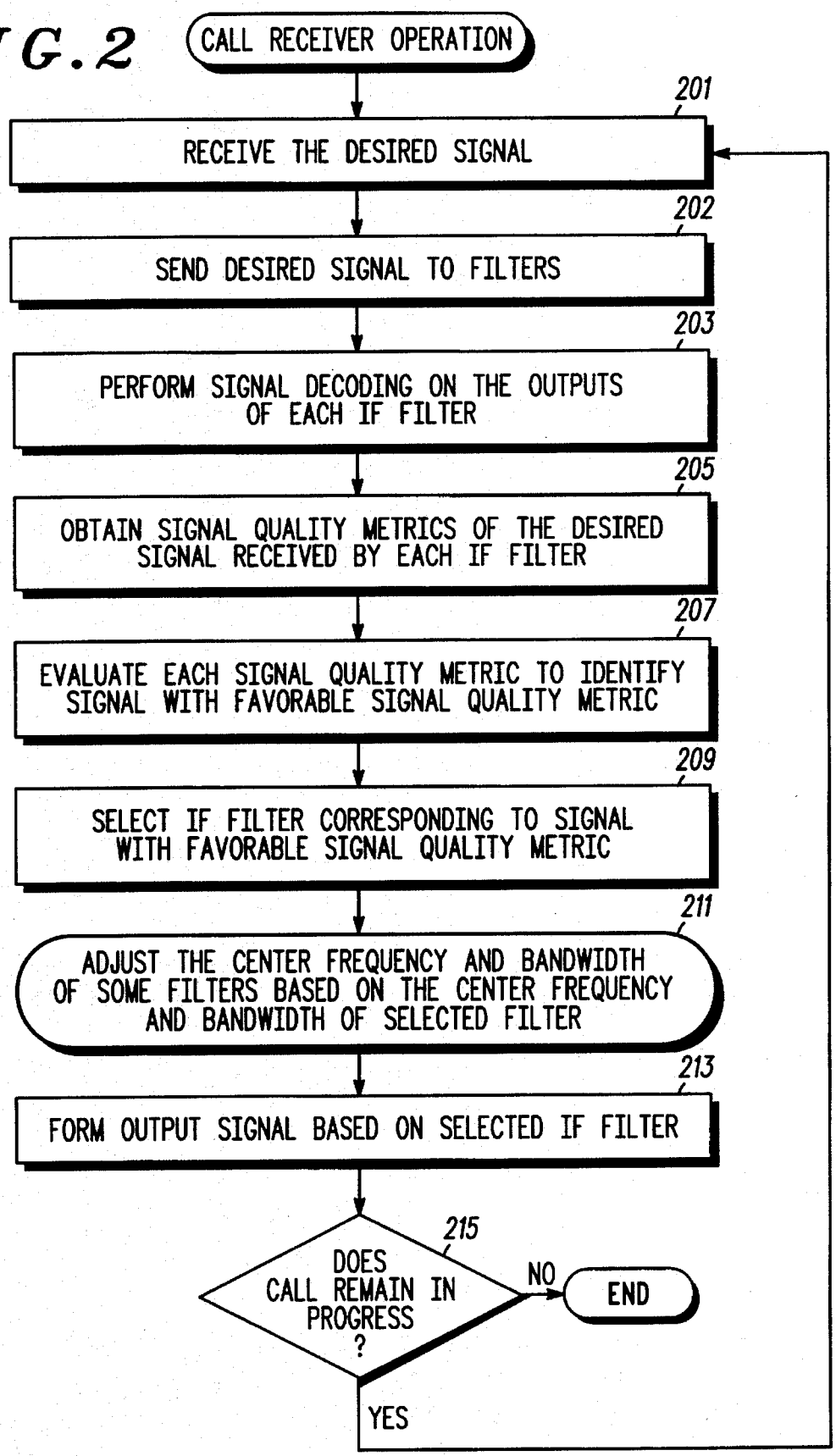
FIG. 2 is a flowchart depicting operation of a call receiver, in accordance with the present invention.

FIG. 2 illustrates a flow chart depicting the operation of an FM call receiver, in accordance with the present invention. In a preferred embodiment, the signal is duplicated and input to each filter. Upon receiving (201) the desired signal, the signal is sent (202) to each of the IF filters. Signal decoding is performed (203) on the outputs of each of the IF filters. As is known, in a digital system, the signal recovery might comprise FM discriminators, filters (such as filters matched to the digital pulse shape), and data level slicers. These components recover binary or multi-level digital data representing the desired signal. As is also known, in an analog system, the signal recovery might comprise FM discriminators and filters, such as de-emphasis filters. These components recover analog signals representing the desired signal.

Upon performing signal decoding, the signal quality of each of the recovered signals is obtained (205) by measuring the signal quality metrics of the desired signal received by each IF filter. In a preferred digital system, the signal quality of the recovered data is measured by squaring the difference between the actual and expected signal levels for each recovered digital symbol and adding this value to an accumulator contained in each quality metric generator. The accumulators are set to zero at the beginning of a communication, and then accumulate the squared difference between the actual and expected recovered signal level. After a period of time, the contents of each accumulator are compared to the contents of each other accumulator, such that a signal having a favorable signal quality is identified.

In a preferred analog system, signal quality might be measured by measuring the power of the signal output by the discriminator above approximately 3 kHz. Since a typical land-mobile transmitter filters out frequency components above 3 kHz, their presence in the received signal is most probably due to noise, distortion, or interference.

The encoder evaluates (207) each signal to identify the signal having the highest signal quality metric. In a digital system, the difference between the actual and expected recovered signal levels in the accumulator is an error measurement—i.e., the error between the actual and expected signal value. Therefore, a lower accumulator value indicates a higher quality level. In an analog system, less power above 3 kHz indicates a higher quality level.

The multiplexer then selects (209) the IF filter corresponding to the signal with the favorable signal quality metric. In a digital system, for example, the multiplexer selects the filter that produces the minimum accumulator value. In an analog system, the multiplexer selects the filter that produces the lowest power above 3 kHz. The center frequencies and bandwidths of some of the filters are adjusted (211), as later described, to maximize the signal quality of the desired signal.

The multiplexer then forms (213) an output signal by selecting the output of the IF filter having the favorable signal quality metric. The outputted signal is then used in the same manner as a prior art receiver might use the recovered signal—e.g., sent to a transducer for audio generation.

Next, it is determined (215) whether the present call remains in progress. Digital systems, such as an APCO 25 system, detect a communication termination by call terminator words or the loss of a number of consecutive frame synchronization words. Analog systems detect communication termination by loss of an RF carrier. Once communication termination is detected, the recovered signal quality process and filter updating processes cease. At this point, the filtering elements might be reset to initial conditions, unless there is a countervailing interest in not doing so.

Figure 3:
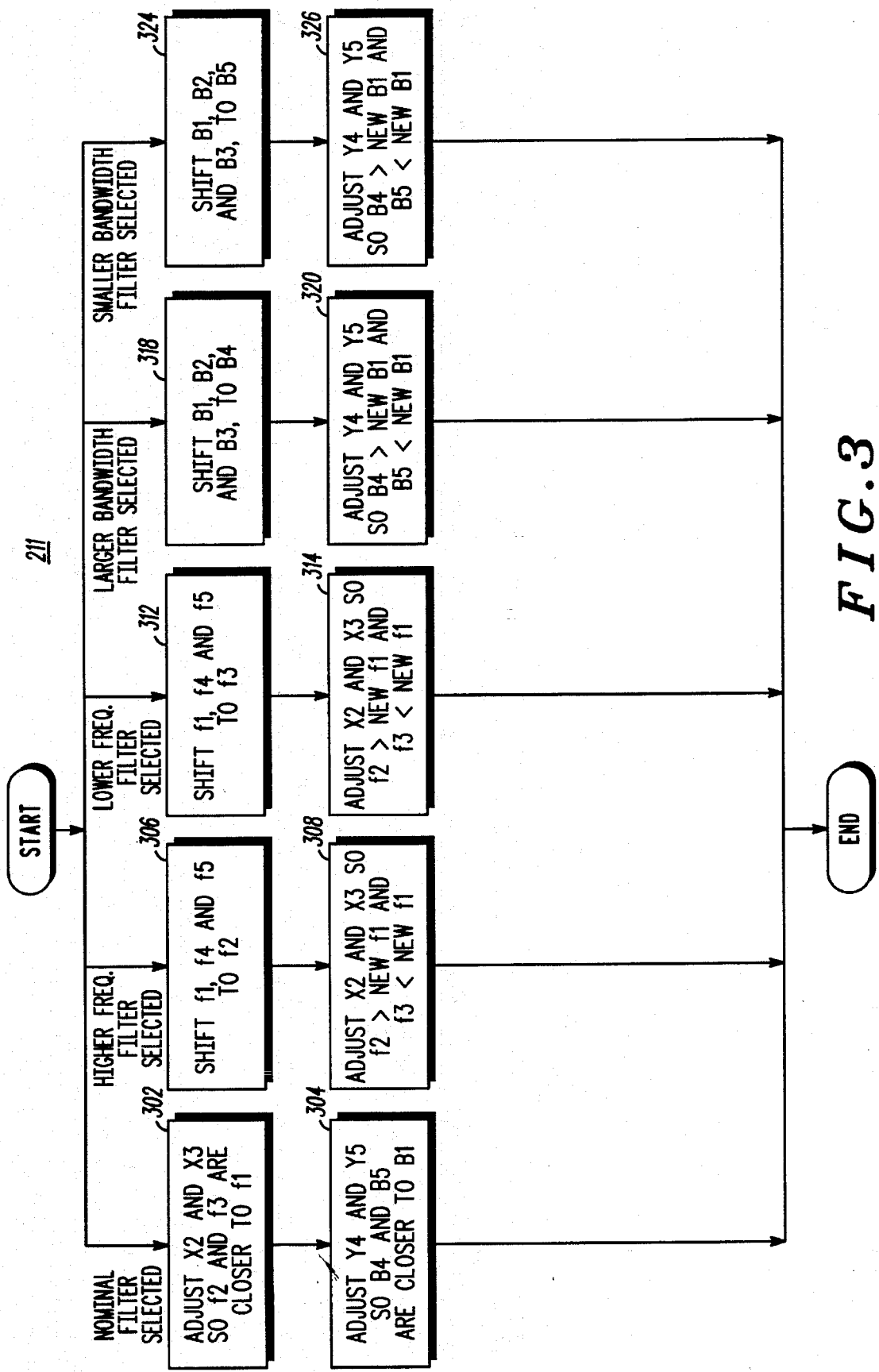
FIG. 3 is a flowchart depicting the adjustment process set forth in FIG. 2.

FIG. 3 illustrates the center frequency and bandwidth adjustment process (211 shown in FIG. 2) for each filter. For purposes of this description, it is presumed that the signal recovery process occurs in a digital system. At the beginning of a communication, the nominal filter is selected. The higher frequency, lower frequency, larger bandwidth, and smaller bandwidth filters have previously been adjusted to their initial conditions, as previously discussed. The multiplexer then routes the signal recovered from the nominal filter to the output. The accumulators in the quality metric generators are cleared and the quality of the signals recovered from each filter are measured for a predetermined time—e.g., 100–200 milliseconds in an APCO 25 receiver. At the end of this time, the signal qualities are evaluated and the filter that yields the lowest accumulator value is selected.

If, after the evaluation of the signal quality metrics, the nominal filter (120) is selected, the frequency adjust values X2, X3 are reduced (e.g., multiplying by a non-negative constant less than 1) so that the center frequencies of the higher frequency and lower frequency filters are adjusted (302) closer to that of the nominal filter. Similarly, the bandwidth adjust values of Y4 and Y5 are reduced (304, e.g., multiplying by a non-negative constant less than 1) so that the bandwidths of the larger bandwidth and smaller bandwidth filters are adjusted closer to the bandwidth of the nominal filter. In a preferred embodiment, the center frequency and bandwidth of the nominal filter do not change in this case.

When the higher frequency filter (121) is selected, the center frequencies of the nominal, larger bandwidth and smaller bandwidth filters shift (306) to the center frequency of the higher frequency filter. The values of X2 and X3 are adjusted (308) by a predetermined amount so the center frequency of the higher frequency filter is greater than the center frequency of the nominal filter and the center frequency of the lower frequency filter is less than the center frequency of the nominal filter. In a preferred embodiment, the values of X2 and X3 are adjusted by multiplying X2 by $\alpha 2$, and by multiplying X3 by $\alpha 3$, where $\alpha 2$ and $\alpha 3$ are non-negative constants greater than 1. The bandwidths of the filters do not change in this case.

When the lower frequency filter (122) is selected, the center frequencies of the nominal, larger bandwidth, and smaller bandwidth filters are shifted (312) to the center frequency of the lower frequency filter. The values of X2 and X3 are adjusted (314) by a predetermined amount so the center frequency of the higher frequency filter is greater than the center frequency of the nominal filter and the center frequency of the lower frequency filter is less than the center frequency of the nominal filter. In a preferred embodiment, the values of X2 and X3 are adjusted by multiplying X2 by $\alpha 2$, and by multiplying X3 by $\alpha 3$, where $\alpha 2$ and $\alpha 3$ are non-negative constants greater than 1. The bandwidths of the filters do not change in this case.

If the larger bandwidth filter (123) is selected, the bandwidths of the nominal, higher frequency and lower frequency filters are shifted (318) to the bandwidth of the larger bandwidth filter. The values of Y4 and Y5 are adjusted (320) by a predetermined amount so that the bandwidth of the larger bandwidth filter is larger than the bandwidth of the nominal filter and the bandwidth of the smaller bandwidth filter is smaller than the bandwidth of the nominal filter. In a preferred embodiment, the values of Y4 and Y5 are adjusted by multiplying Y4 by $\beta 4$, and by multiplying Y5 by $\beta 5$, where $\beta 4$ and $\beta 5$ are non-negative constants greater than 1. The center frequencies of the filters do not change in this case.

If the smaller bandwidth filter (124) is selected, the bandwidths of the nominal, higher frequency and lower frequency filters are shifted (324) to the bandwidth of the smaller bandwidth filter. The values of Y4 and Y5 are adjusted (326) by a predetermined amount so that the bandwidth of the larger bandwidth filter is larger than the bandwidth of the nominal filter and the bandwidth of the smaller bandwidth filter is smaller than the bandwidth of the nominal filter. In a preferred embodiment, the values of Y4 and Y5 are adjusted by multiplying Y4 by $\beta 4$, and by multiplying Y5 by $\beta 5$, where $\beta 4$ and $\beta 5$ are non-negative constants greater than 1. The center frequencies of the filters do not change in this case.

According to the invention, each time the nominal filter (120) is selected, the center frequencies of the higher frequency filter (121) and the lower frequency filter (122) adjust closer to the center frequency of the nominal filter (120), until minimum values for X2 and X3 are obtained. Thus, eventually, the frequency offsets of the nominal, higher frequency, and lower frequency filters (120–122) will converge to a frequency offset nearly maximizing the signal quality of the recovered signal. Likewise, the bandwidths of the larger bandwidth filter (123) and the smaller bandwidth filter (124) are adjusted closer to the bandwidth of the nominal filter (120), until minimum values for Y4 and Y5 are obtained. Thus, the bandwidths of the larger bandwidth filter (123) and the smaller bandwidth filter (124) will eventually converge to a bandwidth nearly maximizing the signal quality of the recovered signal.

Although reducing X2 and X3 to zero yields a final frequency offset that maximizes the signal quality of the recovered signal, and reducing Y4 and Y5 to zero yields a final bandwidth that maximizes the signal quality of the recovered signal, the minimum values for X2, X3, Y4, and Y5 should be greater than zero. If X2 or X3 reduce to zero, the nominal, higher frequency, and lower frequency filters (120–122) would have the same characteristics, and thus, the same signal quality metric. Similarly, if Y4 or Y5 reduce to zero, the larger bandwidth filter (123) and the smaller bandwidth filter (124) would have the same characteristics, and thus, the same signal quality metric. If the nominal, higher frequency, and lower frequency filters (120–122) have the same signal quality metric, and if the larger bandwidth filter (123) and the smaller bandwidth filter (124)

have the same signal quality metric, there is no way to know which way to adjust the center frequency or the bandwidth of the filters to maximize the signal quality. Accordingly, there is incentive to prevent the convergence of these parameters by restricting the range of adjustment values used in the adjustment process.

Figure 4:
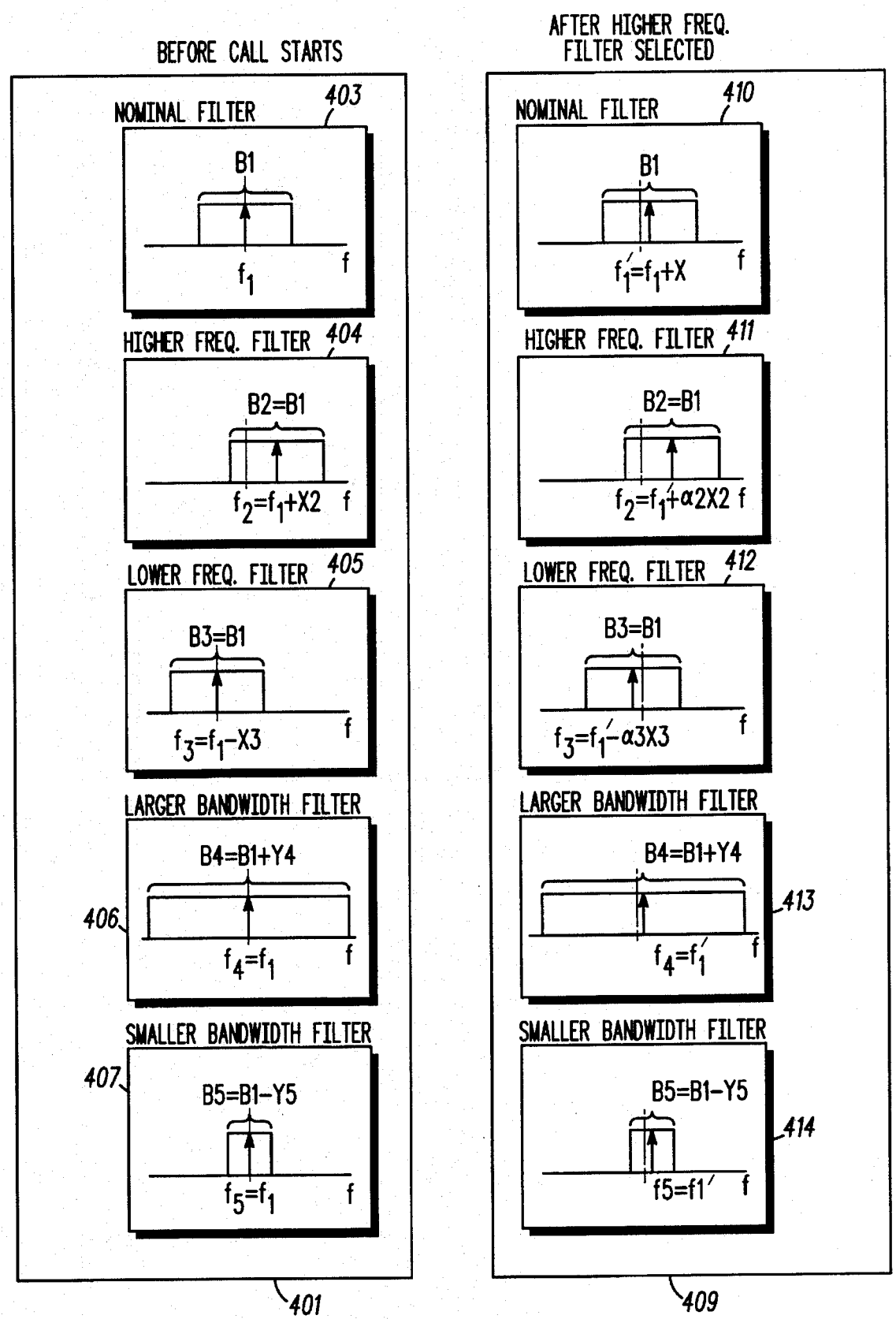
FIG. 4 is a graphical representation of an exemplary filter adjustment, in accordance with the present invention.

FIG. 4 illustrates the adjustments the filters might go through during a communication sequence. In this example, the higher frequency filter is selected in the second cycle (409) of the signal recovery process. Only one adjustment cycle is shown and the selection of only one filter is shown due to symmetric nature of the selection process (i.e., to understand one is to understand all of them). As can be seen, the new center frequency of the nominal filter (410) is f1+X. The center frequency of the higher frequency filter (411) is adjusted to be the new center frequency of the nominal filter plus $\alpha2 \cdot X2$ (X2 multiplied by $\alpha2$). The new frequency of the lower frequency filter (412) is adjusted to be the new frequency of the nominal filter minus $\alpha3 \cdot X3$ (X3 multiplied by $\alpha3$). The center frequencies of the larger bandwidth filter (413) and the smaller bandwidth filter (414) are adjusted to be the same as the new center frequency of the nominal filter. This description represents the filter adjustments of one cycle of the signal recovery process. However, in an actual radio receiver this procedure would be repeated many times during a communication.

The present invention provides a method for reducing the effect of adjacent channel interference on a desired signal. With such a method, the problems of the prior art are substantially eliminated. For example, prior art AFC circuits attempt to tune a receiver filter by changing the frequency of the receiver's local oscillator, thereby placing the desired signal in the center of the receiver filter. In an environment with adjacent channel interference, however, this might actually degrade the quality of the recovered signal by moving the frequency of the receiver closer to the adjacent channel interference source. The present invention provides for a complex adjustment of a plurality of receiver filters to maximize the quality of the recovered signal.

What is claimed is:

1. In an FM receiver configured to receive a desired signal at a frequency f1, the FM receiver including a plurality of filtering elements that each apply a filter response to an inputted signal, the plurality of filtering elements including:

a nominal filter response having a center frequency f1 and a bandwidth B1;

a higher frequency filter response having a center frequency f2 and a bandwidth B2, wherein f2 is substantially equal to (f1+X2), wherein X2 is a variable frequency offset and wherein B2 is substantially equal to B1;

a lower frequency filter response having a center frequency f3 and a bandwidth B3, wherein f3 is substantially equal to (f1−X3), wherein X3 is a variable frequency offset and wherein B3 is substantially equal to B1;

a larger bandwidth filter response having a center frequency f4 and a bandwidth B4, wherein f4 is substantially equal to f1, and wherein B4 is substantially equal to (B1+Y4), and wherein Y4 is a variable bandwidth offset;

a smaller bandwidth filter response having a center frequency f5 and a bandwidth B5, wherein f5 is substantially equal to f1, and wherein B5 is substantially equal to (B1−Y5), and wherein Y5 is a variable bandwidth offset;

wherein the center frequency and bandwidth for each of the plurality of filtering elements are adjustable;

a method for recovering the desired signal, the method comprising the steps of:

A) inputting, to each of the plurality of filtering elements, the desired signal;

B) performing a signal recovery of the desired signal on an output of each of the plurality of filtering elements to obtain a plurality of recovered signals; and C) measuring the plurality of recovered signals to obtain a plurality of signal quality metrics for the desired signal.

2. The method of claim 1, wherein X2 and X3 are based, at least in part, on a frequency offset sensitivity level for the FM receiver.

3. The method of claim 1, wherein Y4 and Y5 are based, at least in part, on a channel bandwidth level for the FM receiver.

4. The method of claim 1, wherein the FM receiver further includes an encoder and a multiplexer, the method further comprising the steps of:

D) evaluating, at the encoder, each of the plurality of signal quality metrics for the desired signal to identify a recovered signal having a favorable signal quality metric; and E) selecting, via the multiplexer, an output from a corresponding one of the plurality of filtering elements, thereby producing a selected filtering element that produces the recovered signal having the favorable signal quality metric.

5. The method of claim 4, further comprising the steps of:

F) adjusting the center frequency and the bandwidth of at least one of the plurality of filtering elements, based on the center frequency and bandwidth of the selected filtering element; and G) forming an output signal based on the selected filtering element.

6. The method of claim 5, wherein the FM receiver is operative to facilitate a communication, the method further comprising the steps of:

H) determining whether the communication remains in progress; and

I) while the communication remains in progress, continuously repeating the step of inputting, to the plurality of filtering elements, the desired signal.

7. The method of claim 5, wherein the nominal filter response is selected in step E), and wherein step F) comprises the steps of:

F1) adjusting X2;

F2) adjusting X3;

F3) adjusting Y4; and

F4) adjusting Y5.

8. The method of claim 7, wherein the step of adjusting X2 comprises the step of multiplying X2 by $\alpha2$, wherein $\alpha2$ is a non-negative constant.

9. The method of claim 7, wherein the step of adjusting X3 comprises the step of multiplying X3 by $\alpha3$, wherein $\alpha3$ is a non-negative constant.

10. The method of claim 7, wherein the step of adjusting Y4 comprises the step of multiplying Y4 by $\beta4$, wherein $\beta4$ is a non-negative constant.

11. The method of claim 7, wherein the step of adjusting Y5 comprises the step of multiplying Y5 by $\beta5$, wherein $\beta5$ is a non-negative constant.

12. The method of claim 5, wherein the higher frequency filter response is selected in step E), and wherein step F) comprises the steps of:

F1) shifting f1, f4, and f5, such that they are substantially equal to f2;

F2) adjusting X2; and

F3) adjusting X3.

13. The method of claim 12, wherein the step of adjusting X2 comprises the step of multiplying X2 by $\alpha 2$, wherein $\alpha 2$ is a non-negative constant.

14. The method of claim 12, wherein the step of adjusting X3 comprises the step of multiplying X3 by $\alpha 3$, wherein $\alpha 3$ is a non-negative constant.

15. The method of claim 5, wherein the lower frequency filter response is selected in step E), and wherein step F) comprises the steps of:

F1) shifting f1, f4 and f5, such that they are substantially equal to f3;

F2) adjusting X2; and

F3) adjusting X3.

16. The method of claim 15, wherein the step of adjusting X2 comprises the step of multiplying X2 by $\alpha 2$, wherein $\alpha 2$ is a non-negative constant.

17. The method of claim 15, wherein the step of adjusting X3 comprises the step of multiplying X3 by $\alpha 3$, wherein $\alpha 3$ is a non-negative constant.

18. The method of claim 5, wherein the larger bandwidth filter response is selected in step E), and wherein step F) comprising the steps of:

F1) shifting B1, B2, and B3, such that they are substantially equal to B4;

F2) adjusting Y4; and

F3) adjusting Y5.

19. The method of claim 18, wherein the step of adjusting Y4 comprises the step of multiplying Y4 by $\beta 4$, wherein $\beta 4$ is a non-negative constant.

20. The method of claim 18, wherein the step of adjusting Y5 comprises the step of multiplying Y5 by $\beta 5$, wherein $\beta 5$ is a non-negative constant.

21. The method of claim 5, wherein the smaller bandwidth filter response is selected in step D), and wherein step F) comprises the steps of:

F1) adjusting B1, B2, and B3, such that they are substantially equal to B5;

F2) adjusting Y4; and

F3) adjusting Y5.

22. The method of claim 21, wherein the step of adjusting Y4 comprises the step of multiplying Y4 by $\beta 4$, wherein $\beta 4$ is a non-negative constant.

23. The method of claim 21, wherein the step of adjusting Y5 comprises the step of multiplying Y5 by $\beta 5$, wherein $\beta 5$ is a non-negative constant.

24. An FM receiver configured to receive a desired signal at a frequency f1, the FM receiver comprising:

a plurality of filters including;

a nominal filter with a center frequency f1 and a bandwidth B1;

a higher frequency filter with a center frequency f2 and a bandwidth B2, wherein f2 is substantially equal to (f1+X2), wherein X2 is a variable frequency offset, and wherein B2 is substantially equal to B1;

a lower frequency filter with a center frequency f3 and a bandwidth B3, wherein f3 is substantially equal to (f1−X3), wherein X3 is a variable frequency offset, and wherein B3 is substantially equal to B1;

a larger bandwidth filter with a center frequency f4 and a bandwidth B4, wherein f4 is substantially equal to f1, wherein B4 is substantially equal to (B1+Y4), and wherein Y4 is a variable bandwidth offset;

a smaller bandwidth filter with a center frequency f5 and a bandwidth B5, wherein f5 is substantially equal to f1, wherein B5 is substantially equal to (B1−Y5), and wherein Y5 is a variable bandwidth offset;

wherein the center frequency and bandwidth for each of the plurality of filters is adjustable;

an antenna, operably coupled to an input for each of the plurality of filters;

a plurality of signal decoders operably coupled to receive a filtered signal from at least a corresponding one of the plurality of filters; and a quality metric generator, operably coupled to receive at least a portion of the filtered signal, thereby producing at least one of a plurality of signal quality metrics.

25. The FM receiver of claim 24, further comprising:

an encoder, operably coupled to the quality metric generator, that identifies a favorably recovered signal; and a multiplexer, operably coupled to the encoder, that forms a usable output signal based, at least in part, on the favorably recovered signal.

26. The FM receiver of claim 25, further comprising means for adjusting the center frequency and the bandwidth of at least some of the plurality of filters, based on the center frequency and bandwidth of a filter corresponding to the favorably recovered signal.

27. An FM receiver configured to receive a desired signal at a frequency f1, the FM receiver comprising:

a plurality of filters, including;

a nominal filter with a center frequency f1 and a bandwidth B1;

a higher frequency filter with a center frequency f2 and a bandwidth B2, wherein f2 is substantially equal to (f1+X2), wherein X2 is a variable frequency offset, and wherein B2 is substantially equal to B1; and a lower frequency filter with a center frequency f3 and a bandwidth B3, wherein f3 is substantially equal to (f1−X3), wherein X3 is a variable frequency offset, and wherein B3 is substantially equal to B1;

wherein the center frequency and bandwidth for each of the plurality of filters is adjustable;

means for performing a signal recovery of the desired signal on an output of each of the plurality of filters to obtain a plurality of recovered signals; and means for measuring the plurality of recovered signals to obtain a plurality of signal quality metrics, wherein each of the plurality of signal quality metrics corresponds to one of the plurality of filters.

28. The FM receiver of claim 27, further comprising:

a larger bandwidth filter with a center frequency f4 and a bandwidth B4, wherein f4 is substantially equal to f1, wherein B4 is substantially equal to (B1+Y4), and wherein Y4 is a variable bandwidth offset; and a smaller bandwidth filter with a center frequency f5 and a bandwidth B5, wherein f5 is substantially equal to f1, wherein B5 is substantially equal to (B1−Y5), and wherein Y5 is a variable bandwidth offset.

29. The FM receiver of claim 27, further comprising:

means for evaluating each of the plurality of signal quality metrics to identify a favorably recovered signal; and means for selecting one of the plurality of filters that corresponds to the favorably recovered signal, thereby producing a selected filter.

30. The FM receiver of claim 29, further comprising:

means for adjusting the center frequency and the bandwidth of at least some of the plurality of filters, based on the center frequency and bandwidth of the selected filter; and means for forming a usable output signal based on the selected filter.

31. An FM receiver configured to receive a desired signal at a frequency f1, the FM receiver comprising:

a plurality of filters, including;
  a nominal filter with a center frequency f1 and a bandwidth B1;
  a larger bandwidth filter with a center frequency f4 and a bandwidth B4, wherein f4 is substantially equal to f1, wherein B4 is substantially equal to (B1+Y4), and wherein Y4 is a variable bandwidth offset; and
  a smaller bandwidth filter with a center frequency f5 and a bandwidth B5, wherein f5 is substantially equal to f1, wherein B5 is substantially equal to (B1-Y5), and wherein Y5 is a variable bandwidth offset;

wherein the center frequency and bandwidth for each of the plurality of filters is adjustable;

means for performing a signal recovery of the desired signal on an output of each of the plurality of filters to obtain a plurality of recovered signals; and means for measuring the plurality of recovered signals to obtain a plurality of signal quality metrics, wherein each of the plurality of signal quality metrics corresponds to one of the plurality of filters.

32. The FM receiver of claim 31, further comprising:

means for evaluating each of the plurality of signal quality metrics to identify a favorably recovered signal; and means for selecting one of the plurality of filters that corresponds to the favorably recovered signal, thereby producing a selected filter.

33. In an FM receiver configured to receive a desired signal at a frequency f1, the FM receiver including an encoder, a multiplexer, and a plurality of filtering elements that each apply a filter response to an inputted signal, the plurality of filtering elements including:

a nominal filter response having a center frequency f1 and a bandwidth B1;

a higher frequency filter response having a center frequency f2 and a bandwidth B2, wherein f2 is substantially equal to (f1+X2), wherein B2 is substantially equal to B1, and wherein X2 is based, at least in part, on a frequency offset sensitivity level for the FM receiver;

a lower frequency filter response having a center frequency f3 and a bandwidth B3, wherein f3 is substantially equal to (f1–X3), wherein B3 is substantially equal to B1, and wherein X3 is based, at least in part, on a frequency offset sensitivity level for the FM receiver;

a larger bandwidth filter response having a center frequency f4 and a bandwidth B4, wherein f4 is substantially equal to f1, wherein B4 is substantially equal to (B1+Y4), and Y4 is based, at least in part, on a channel bandwidth level for the FM receiver;

a smaller bandwidth filter response having a center frequency f5 and a bandwidth B5, wherein f5 is substantially equal to f1, wherein B5 is substantially equal to (B1-Y5), and Y5 is based, at least in part, on a channel bandwidth level for the FM receiver;

wherein the center frequency and bandwidth for each of the plurality of filtering elements are adjustable;

a method for recovering the desired signal, the method comprising the steps of:

A) inputting, to each of the plurality of filtering elements, the desired signal;

B) performing a signal recovery of the desired signal on an output of each of the plurality of filtering elements to obtain a plurality of recovered signals;

C) measuring the plurality of recovered signals to obtain a plurality of signal quality metrics for the desired signal;

D) evaluating, at the encoder, each of the plurality of signal quality metrics for the desired signal to identify a recovered signal having a favorable signal quality metric;

E) selecting, via the multiplexer, a corresponding one of the plurality of filtering elements, wherein a selected filtering element produces the recovered signal having the favorable signal quality metric;

F) adjusting the center frequency and the bandwidth of at least some of the plurality of filtering elements, based on the center frequency and bandwidth of the selected filtering element;

G) forming a usable output signal based on the selected filtering element;

H) determining whether a communication remains in progress; and

I) while the communication remains in progress, continuously repeating the step of inputting, to the plurality of filtering elements, the desired signal.

* * * * *